United States Patent
Lee et al.

(10) Patent No.: US 10,580,793 B2
(45) Date of Patent: Mar. 3, 2020

(54) SEMICONDUCTOR DEVICE AND MANUFACTURING METHOD THEREOF

(71) Applicant: SK hynix Inc., Gyeonggi-do (KR)

(72) Inventors: Ki Hong Lee, Gyeonggi-do (KR); Seung Wook Ryu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/151,406

(22) Filed: Oct. 4, 2018

(65) Prior Publication Data

US 2019/0252402 A1  Aug. 15, 2019

(30) Foreign Application Priority Data

Feb. 12, 2018  (KR) .................. 10-2018-0016941

(51) Int. Cl.
*H01L 29/792* (2006.01)
*H01L 27/11582* (2017.01)
*H01L 21/02* (2006.01)
*H01L 27/11568* (2017.01)

(52) U.S. Cl.
CPC .. *H01L 27/11582* (2013.01); *H01L 21/02238* (2013.01); *H01L 27/11568* (2013.01)

(58) Field of Classification Search
CPC ............ H01L 29/0649; H01L 29/7889; H01L 29/7926
See application file for complete search history.

(56) References Cited

U.S. PATENT DOCUMENTS 9,543,319 B1   1/2017 Wu et al.
10,297,611 B1 * 5/2019 Wells ................ H01L 27/11582
2017/0213842 A1 * 7/2017 Park .................. H01L 21/02164

FOREIGN PATENT DOCUMENTS

KR   1020170088108   8/2017

* cited by examiner

*Primary Examiner* — Thomas L Dickey
(74) *Attorney, Agent, or Firm* — IP & T Group LLP

(57) ABSTRACT

In a method of manufacturing a semiconductor device, the method includes: forming a stack structure; forming a channel layer penetrating the stack structure; forming a first dielectric layer in the channel layer; forming a second dielectric layer in the first dielectric layer; forming an opening by selectively etching the first dielectric layer; selectively etching the second dielectric layer exposed through the opening; and forming a pad in the opening.

18 Claims, 14 Drawing Sheets

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2018-0016941, filed on Feb. 12, 2018, which is incorporated herein by reference in its entirety.

BACKGROUND

Field of Invention

The present disclosure generally relates to an electronic device, and more particularly, to a semiconductor device and a manufacturing method thereof.

Description of Related Art

A nonvolatile memory device retains stored data even when the supply of power to the device is cut off. Recently, as the improvements in the degree of integration of two-dimensional nonvolatile memory devices in which memory cells are formed in a single layer on a substrate have reached an upper limit, three-dimensional nonvolatile memory devices have been proposed in which memory cells are vertically stacked in multiple layers on a substrate.

Typically, a three-dimensional nonvolatile memory device includes a plurality of alternately stacked interlayer insulating layers and gate electrodes. Channel layers penetrate the interlayer insulating layers and the gate electrodes and memory cells are stacked along the channel layers. Various structures and manufacturing methods have been developed for improving the operational reliability of the three-dimensional non-volatile memory device but further improvements are needed.

SUMMARY

Various embodiments of the present invention provide a semiconductor device having an improved stable structure with improved characteristics and which facilitates a manufacturing process for making the semiconductor device. Various other embodiments of the present invention provide a manufacturing method for the semiconductor device.

In accordance with an aspect of the present disclosure, there is provided a method of manufacturing a semiconductor device, the method including: forming a stack structure; forming a channel layer penetrating the stack structure; forming a first dielectric layer in the channel layer; forming a second dielectric layer in the first dielectric layer; forming an opening by selectively etching the first dielectric layer; selectively etching the second dielectric layer exposed through the opening; and forming a pad in the opening.

In accordance with another aspect of the present disclosure, there is provided a method of manufacturing a semiconductor device, the method including: forming a stack structure; forming a channel layer penetrating the stack structure; forming a gap fill layer in the channel layer, wherein the gap fill layer includes a first dielectric layer and a second dielectric layer, which have different etching rates; forming an opening by selectively etching the first dielectric layer; selectively etching the second dielectric layer exposed through the opening; and forming a pad in the opening.

In accordance with still another aspect of the present disclosure, there is provided a semiconductor device including: a stack structure; a channel layer penetrating the stack structure; a first dielectric layer formed in the channel layer; a second dielectric layer formed in the first dielectric layer; and a third dielectric layer interposed between the first dielectric layer and the second dielectric layer, the third dielectric layer including a material having a higher etching selectivity than the first and second dielectric layers.

In accordance with still another aspect of the present disclosure, there is provided a semiconductor device including: a stack structure; a channel layer penetrating the stack structure; a first dielectric layer formed in the channel layer; a second dielectric layer formed in the first dielectric layer; and a protrusion portion located on the top of the first and second dielectric layers, the protrusion portion protruding into the second dielectric layer. These and other features and advantages of the present invention will become apparent to those with ordinary skill in the art to which the present invention belongs from the following description in conjunction with the accompanying drawings.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
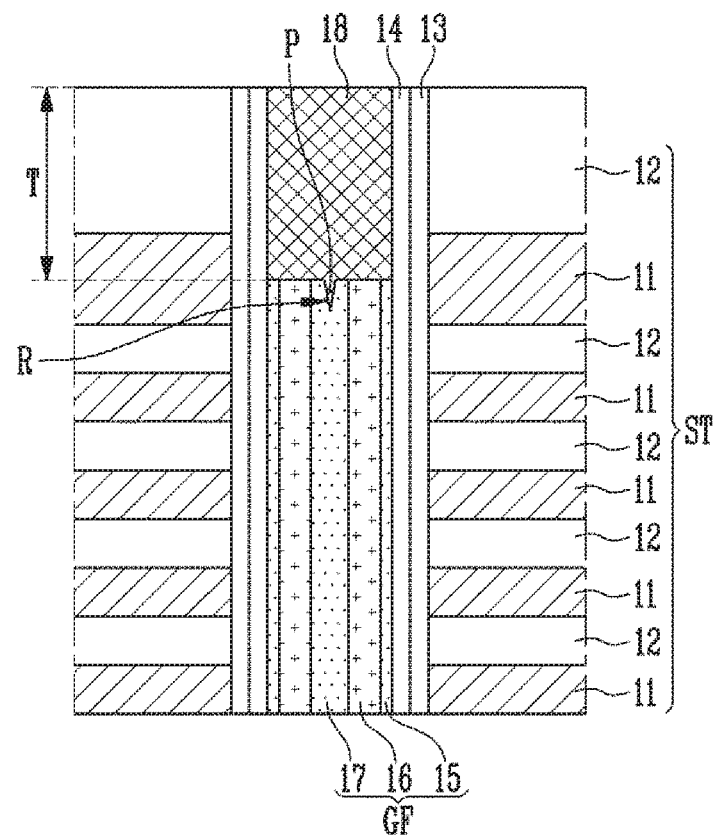
FIGS. 1A to 1D are sectional views illustrating structures of semiconductor devices in accordance with embodiments of the present disclosure.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless clearly stated otherwise.

FIGS. 1A to 1D are sectional views illustrating structures of semiconductor devices in accordance with embodiments of the present disclosure.

Referring to FIGS. 1A to 1D, each of the semiconductor memory devices in accordance with the embodiments of the present disclosure may include a stack structure ST, a channel layer 14, a gap fill layer GF, a pad 18, and a memory layer 13. Although not shown in the drawings, the semiconductor device may further include a lower structure located under the stack structure ST. The lower structure may include a line structure, and a peripheral circuit.

The stack structure ST may include conductive layers 11 and insulating layers 12. The conductive layers 11 and the insulating layers 12 may be alternately stacked. The conductive layers 11 may be gate electrodes. For example, the conductive layers 11 may be gate electrodes of memory cells, selection transistors, and the like. The conductive layers 11 may be made of or include a metal such as tungsten or include a poly-silicon layer, a silicide layer, and the like. The insulating layers 12 are used to insulate the stacked conductive layers 11 from each other, and may be made of or include any suitable insulating material such as an oxide. The oxide may for example be a silicon dioxide.

As an example, at least one uppermost conductive layer 11 may be an upper selection line, at least one lowermost conductive layer 11 may be a lower selection line, and the other conductive layers 11 may be word lines. At least one lower selection transistor, a plurality of memory cells, and at least one upper selection transistor are connected in series, to constitute a vertical memory string. The upper selection transistor may be a drain selection transistor, and the lower selection transistor may be a source selection transistor.

As another example, at least one uppermost conductive layer 11 may be a selection line, at least one lowermost conductive layer 11 may be a pipe gate, and the other conductive layers 11 may be word lines. At least one first selection transistor, a plurality of memory cells, and at least one pipe transistor, a plurality of memory cells, and at least one second selection transistor are connected in series, to constitute a U-shaped memory string. The first selection transistor may be a drain selection transistor, and the second selection transistor may be a source selection transistor.

The channel layer 14 penetrates the stack structure ST. Although one channel layer 14 is illustrated in the drawings, the semiconductor device may include a plurality of channel layers 14. The plurality of channel layers 14 may be spaced apart at a regular interval form each other. The channel layer 14 is used to provide a current path of selection transistors, memory cells, and the like, and may be made of or include a semiconductor material such as silicon (Si) or germanium (Ge). A central region of the channel layer 14 may have an opened structure, and the gap fill layer GF may be filled in the channel layer 14.

The memory layer 13 is interposed between the channel layer 14 and the conductive layers 11. The channel layer 14 may include at least one of a tunnel insulating layer, a data storage layer, and a charge blocking layer. The data storage layer may include a floating gate, a charge trap material, poly-silicon, a nitride, nano dots, a variable resistance material, a phase change material, and the like. Although a structure in which the memory layer 13 is formed in an opening penetrating the stack structure ST and surrounds a sidewall of the channel layer 14 is illustrated in the drawings, the present disclosure is not limited thereto. For example, the memory layer 13 may be interposed only between the channel layer 14 and the conductive layers 11. Also, in another example, the memory layer 13 may also be interposed between the insulating layers and the conductive layers 11.

The gap fill layer GF may have a multi-layered structure including a plurality of dielectric layers 15, 16 and 17. The plurality of dielectric layers 15, 16 and 17 may include materials having different etching rates, respectively. Also, the gap fill layer GF may completely fill in the channel layer 14, or partially fill in the channel layer 14. For example, the gap fill layer GF may include a void V therein, or include a recess R at an uppermost surface thereof.

The upper surface of the gap fill layer GF may be located at a lower level than that of the channel layer 14, or be located at substantially the same level as that of the channel layer 14. Upper surfaces of the plurality of dielectric layers 15, 16 and 17 included in the gap fill layer GF may be located at substantially the same level, or at different levels. Also, the plurality of dielectric layers 15 to 17 included in the gap fill layer GF may have substantially the same thickness, or have different thicknesses.

The pad 18 is disposed on the top of the gap fill layer GF, and is connected to the channel layer 14. The pad 18 electrically connects the channel layer 14 to a line such as a bit line, and may include a junction of a selection transistor. For example, the pad 18 may be made of or include a conductive material such as poly-silicon or metal. Also, the pad 18 may be a poly-silicon layer doped at a high concentration with an N-type impurity, and a region overlapping with a gate of the selection transistor may be used as the junction of the selection transistor.

Also, the pad 18 may include a protrusion portion P protruding into the gap fill layer GF. For example, the protrusion portion P may protrude into the void V included in the gap fill layer GF, or fill in the recess R located at the upper surface of the gap fill layer GF.

Although a case where the upper surface of the gap fill layer GF is located at a low level as compared with that of the channel layer 14, and the pad 18 is formed in the channel layer 14 to be in contact with the inner wall of the channel layer 14 is illustrated in the drawings, the present disclosure is not limited thereto. The upper surface of the gap fill layer GF may be located at substantially the same level as that of the channel layer 14, and the pad 18 may be formed on a top of the channel layer 14 and may be in contact with the upper surface of the channel layer 14.

FIGS. 1A to 1D illustrate various embodiments of the structure and material composition of the gap fill layer GF. The embodiments may be combined, or each embodiment may be modified within the scope of the present disclosure.

Referring to FIG. 1A, the gap fill layer GF may include a plurality of dielectric layers 15, 16 and 17. For example, the gap fill layer GF may include a first dielectric layer 15 formed in the channel layer 14, a third dielectric layer 17 formed in the first dielectric layer 15, and a second dielectric layer 16 interposed between the first dielectric layer 15 and the third dielectric layer 17. The first dielectric layer 15 may be formed conformally along an inside sidewall surface of the channel layer 14, and the second dielectric layer 16 may be formed conformally along an inside sidewall surface of the first dielectric layer 15.

The second dielectric layer 16 may be made of or include a material having a higher etching selectivity than the first dielectric layer 15 and the third dielectric layer 17. For example, the second dielectric layer 16 may be made of or include a nitride layer, and the first dielectric layer 15 and the third dielectric layer 17 may be made of or include an oxide layer.

The third dielectric layer 17 may include a recess R at an uppermost surface thereof. The recess R may have a shape wherein its width is narrowed toward a lower portion thereof. For example, the recess R may have a V shaped cross-section. The recess R may have a lower surface with a sharp tip, or alternatively may have a wedge-shaped section. The recess R may be partially filled by the pad 18, or alternatively may be completely filled by the pad 18.

Figure 1B:
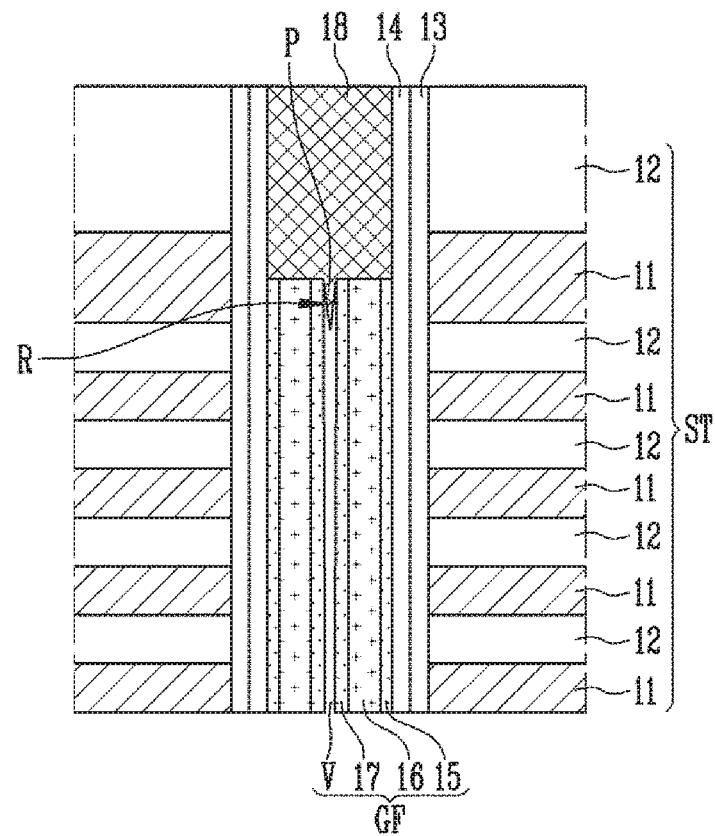

Referring to FIG. 1B, the gap fill layer GF may include a plurality of dielectric layers 15, 16 and 17 and a void V. For example, the gap fill layer GF may include a first dielectric layer 15 formed conformally along an inside sidewall surface of the channel layer 14, a third dielectric layer 17 formed conformally along an inside sidewall surface of the first dielectric layer 15, a second dielectric layer 16 interposed between the first dielectric layer 15 and the third dielectric layer 17, and a void V formed within the third dielectric layer 17. The void V may penetrate through the center of the third dielectric layer 17. The second dielectric layer 16 may be made of or include a material having a higher etching selectivity than the first dielectric layer 15 and the third dielectric layer 17. For example, the second dielectric layer 16 may be made of or include a nitride layer, and the first dielectric layer 15 and the third dielectric layer 17 may be made of or include an oxide layer.

An upper surface of the void V may be defined by the pad 18, and a protrusion portion P of the pad 18 may protrude into the void V. Although a structure in which the void V is formed entirely in the channel layer 14 is illustrated in the drawing, the void V may be formed only at a partial level.

Figure 1C:
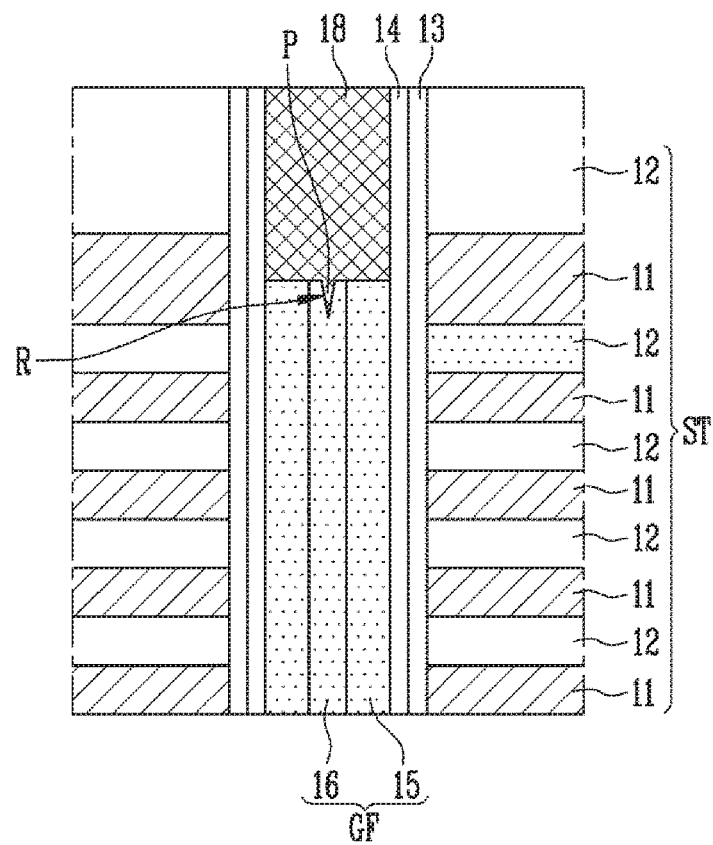

Referring to FIG. 1C, the gap fill layer GF may include a plurality of dielectric layers 15 and 16. For example, the gap fill layer GF may include a first dielectric layer 15 formed conformally along an inside sidewall surface of the channel layer 14 and a second dielectric layer 16 formed conformally along an inside sidewall surface of the first dielectric layer 15.

The second dielectric layer 16 may be made of or include the same material as the first dielectric layer 15, or may be made of or include a material different from that of the first dielectric layer 15. For example, each of the first and second dielectric layers 15 and 16 may be made of or include an oxide layer. An interface may exist between the first dielectric layer 15 and the second dielectric layer 16. In addition, the second dielectric layer 16 fills in an opened central region of the first dielectric layer 15, and may include a recess R at an uppermost surface thereof.

Figure 1D:
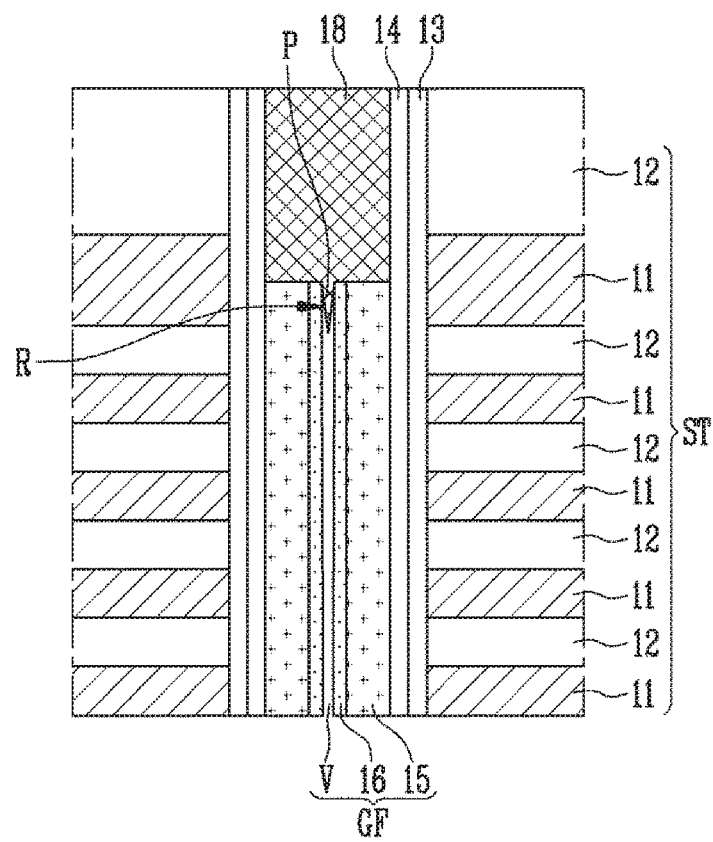

Referring to FIG. 1D, the gap fill layer GF may include a plurality of dielectric layers 15 and 16 and a void V penetrating through the second dielectric layer 16. For example, the gap fill layer GF may include a first dielectric layer 15 formed conformally along an inside sidewall surface of the channel layer 14, a second dielectric layer 16 formed conformally along an inside sidewall surface of the first dielectric layer 15, and a void V formed in the second dielectric layer 16.

The second dielectric layer 16 may be made of or include a material having a higher etching selectivity than the first dielectric layer 15. For example, the first dielectric layer 15 may be made of or include a nitride layer and the second dielectric layer 16 may be made of or include an oxide layer. Alternatively, the first dielectric layer 15 may be made of or include an oxide layer and the second dielectric layer 16 may be made of or include a nitride layer. In addition, the second dielectric layer 16 may include the void V.

According to the structures described above, since the gap fill layer GF has a multi-layered structure, the height of the gap fill layer GF can be controlled more easily and more accurately, and thus the pads 18 can have a uniform thickness T. Thus, the degree where transistors, e.g., selection transistors and the pads 18 overlap with each other can be uniformly controlled. Accordingly, the widths where the selection transistors and the junctions overlap with each other can be controlled to be uniform. Thus, the threshold voltage distribution of the selection transistors can be improved.

FIGS. 2A to 2F are sectional views illustrating a manufacturing method of a semiconductor device in accordance with an embodiment of the present disclosure. Hereinafter, contents overlapping with those described above will be omitted.

Figure 2A:
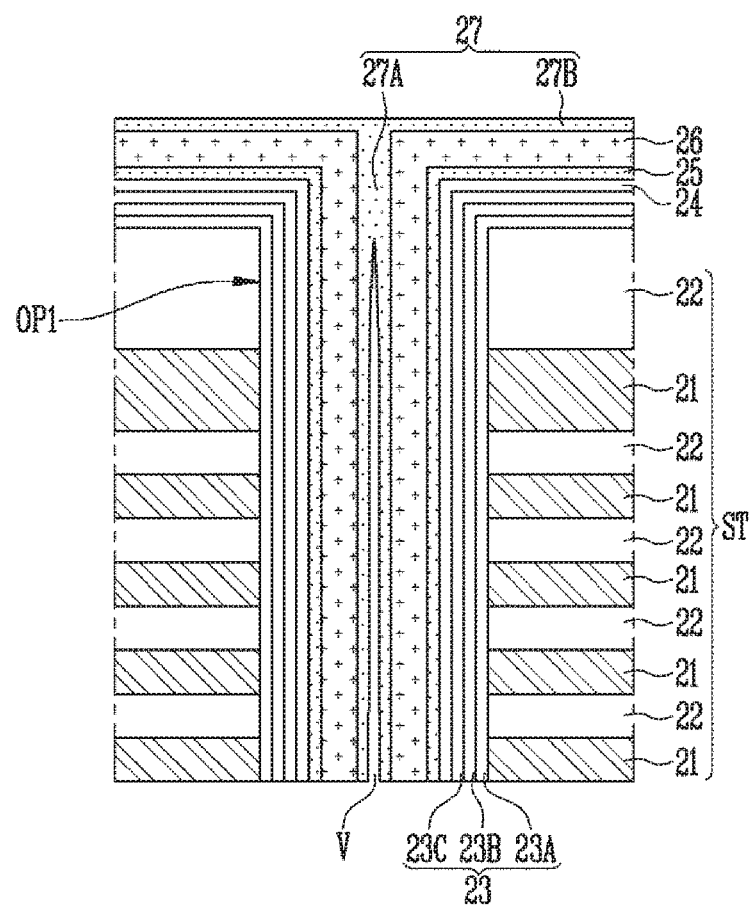
FIGS. 2A to 2F are sectional views illustrating a manufacturing method of a semiconductor device in accordance with an embodiment of the present disclosure.

Referring to FIG. 2A, there is formed a stack structure ST including first material layers 21 and second material layers 22, which are alternately stacked. The first material layers 21 may be used to form gate electrodes of memory cells, selection transistors, and the like, and the second material layers 22 may be used to insulate the stacked gate electrodes from each other.

The first material layers 21 are formed of a material having a higher etching selectivity than the second material layers 22. As an example, the first material layers 21 may be sacrificial layers including nitride, and the like, and the second material layers 22 may be insulating layers including oxide, and the like. As another example, the first material layers 21 may be conductive layers including poly-silicon, tungsten, metal, and the like, and the second material layers 22 may be insulating layers including oxide, and the like. As still another example, the first material layers 21 may be conductive layers including doped poly-silicon, and the like, and the second material layers 22 may be sacrificial layers including undoped poly-silicon, and the like.

Although not shown in the drawing, a lower structure may also be formed below the stack structure ST. In an embodiment, the lower structure may be formed before the stack structure ST is formed. For example, the lower structure may be a peripheral circuit, a line structure, and the like.

Subsequently, a first opening OP1 penetrating the stack structure ST is formed. The first opening OP1 may penetrate the stack structure ST in the stacking direction of the first and second material layers 21 and 22. The first opening OP1 may have a cross-section formed in a circular shape, an elliptical shape, a quadrangular shape, a polygonal shape, and the like. Although one first opening OP1 is illustrated in the drawing, a plurality of first openings OP1 may be formed. The plurality of first openings OP1 may be spaced apart from each other at a regular interval.

Subsequently, a memory layer 23 is formed in the first opening OP1. The memory layer 23 may be formed conformally along an inner sidewall surface of the first opening OP1, and may also be formed on an uppermost surface of the stack structure ST. The memory layer 23 may include at least one of a tunnel insulating layer 23C, a data storage layer 2313, and a charge blocking layer 23A. In addition, a sacrificial layer may be formed before the memory layer 23 is formed. The sacrificial layer may be made of or include an oxide layer. The sacrificial layer may function to prevent the memory layer 23 from being damaged when the first material layers 21 or the second material layers 22 are replaced with third material layers in a subsequent process.

Subsequently, a channel layer 24 is formed in the first opening OP1. The channel layer 24 is formed conformally along the inner sidewall surface of the first opening OP1, and may also be formed on the uppermost surface of the stack structure ST.

Subsequently, a gap fill layer including a plurality of dielectric layers 25 to 27 having different etching rates is formed in the channel layer 24. For example, a first dielectric layer 25 is formed in the channel layer 24, and a second dielectric layer 26 is then formed in the channel layer 25. The first dielectric layer 25 may be formed conformally along an inside sidewall surface of the channel layer 24, and the second dielectric layer 26 may be formed conformally along an inside sidewall surface of the first dielectric layer 25. The second dielectric layer 26 may be made of or include a material having a higher etching selectivity than the first dielectric layer 25. For example, the second dielectric layer 26 may be made of or include a nitride layer and the first dielectric layer 25 may be made of or include an oxide layer. In addition, the first dielectric layer 25 and the second dielectric layer 26 may be formed with a thickness which does not completely fill in the first opening OP1. The first dielectric layer 25 and the second dielectric layer 26 may also be formed on the uppermost surface of the stack structure ST.

Subsequently, a third dielectric layer 27 is formed in the second dielectric layer 26. The third dielectric layer 27 may be made of or include a material having a higher etching selectivity than the second dielectric layer 26. For example, the second dielectric layer 26 may be made of or include a nitride layer and the third dielectric layer 27 may be made of or include an oxide layer.

The third dielectric layer 27 may completely fill in the first opening OP1, or alternatively may be formed with a thickness which only partially fills in the first opening OP1. The third dielectric layer 27 may also be formed on the uppermost surface of the stack structure ST. The third dielectric layer 27 may include a first region 27A penetrating the stack structure ST and a second region 27B formed on the top of the stack structure ST. When the third dielectric layer 27 completely fills in the first opening OP1, the third dielectric layer 27 does not include a void V. When the third dielectric layer 27 partially fills in the first opening OP1, the void V may be formed in the first region 27A. Hereinafter, a case where the third dielectric layer 27 includes the void V will be described.

Figure 2B:
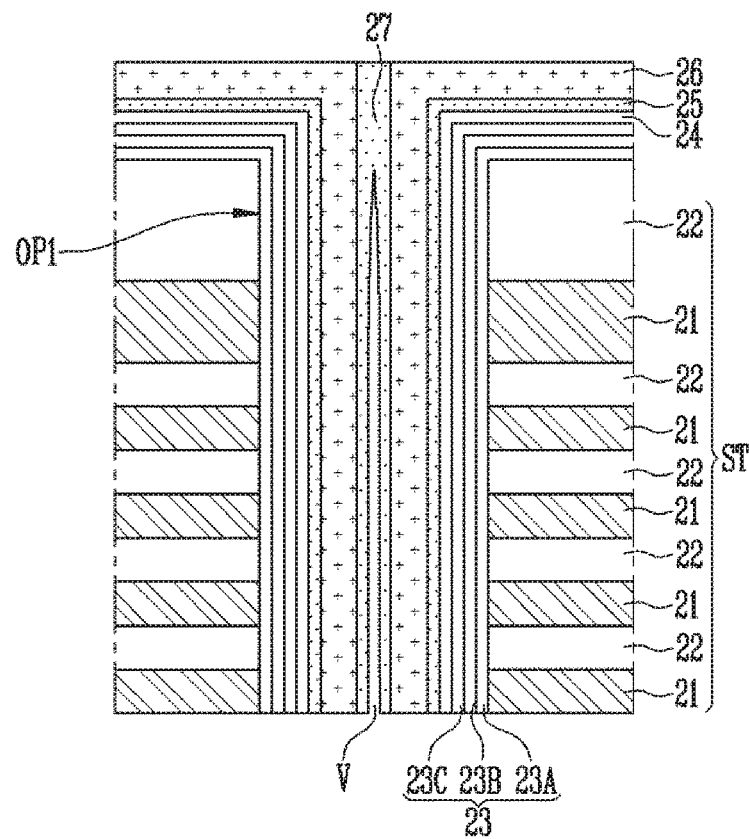

Referring to FIG. 2B, the third dielectric layer 27 is partially removed such that the second dielectric layer 26 is exposed. For example, the second region 27B of the third dielectric layer 27 is etched using a dry cleaning process. When the third dielectric layer 27 includes the void V, the etching amount of the third dielectric layer 27 may be controlled such that the void V in the third dielectric layer 27 is not exposed.

Figure 2C:
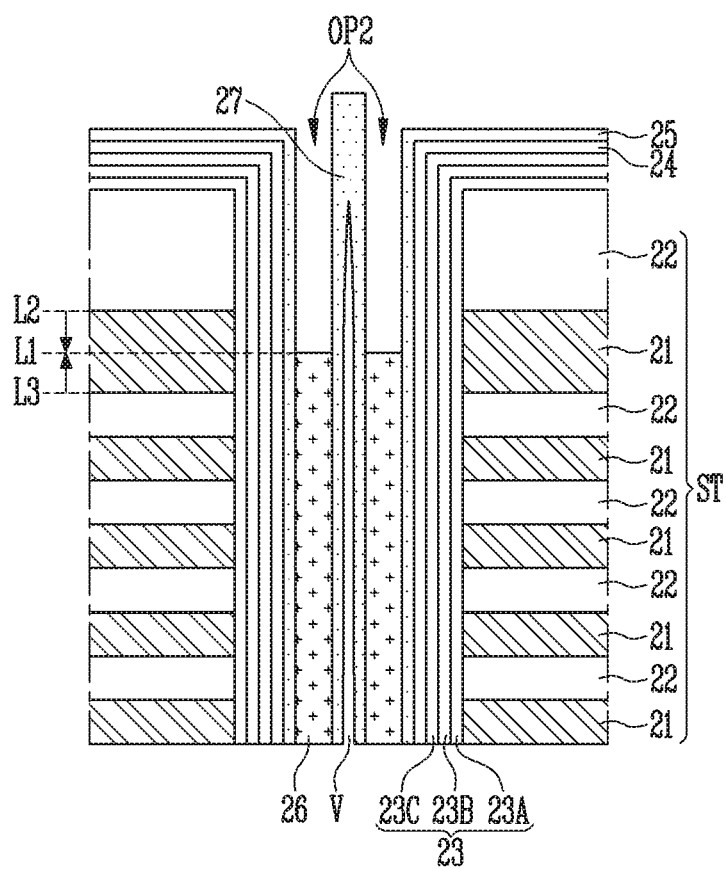

Referring to FIG. 2C, a second opening OP2 is formed by selectively etching the second dielectric layer 26. For example, the second dielectric layer 26 is selectively etched under a condition in which the second dielectric layer 26 has a higher etching selectivity than the first and third dielectric layers 25 and 27 or under a condition in which the second dielectric layer 26 has a higher etching rate as compared with the first and third dielectric layers 25 and 27. Therefore, the third dielectric layer 27 may protrude from an uppermost surface of the second dielectric layer 26.

The second opening OP2 is used to secure a region in which a pad is to be formed in a subsequent process. Therefore, a bottom surface of the second opening OP2, i.e., the upper surface of the second dielectric layer 26 may be located at a first level L1. The first level L1 may be located lower than an uppermost surface of the uppermost first material layer 21 (L1<L2). The first level L1 may be located higher than a lower surface of the uppermost first material layer 21 (L1>L3).

Figure 2D:
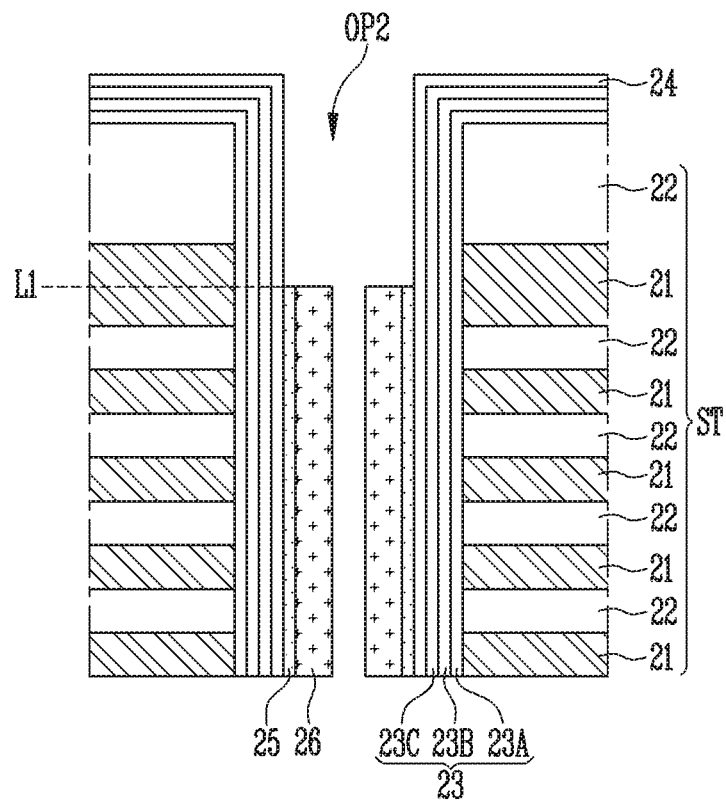

Referring to FIG. 2D, the third dielectric layer 27 exposed in the second opening OP2 is etched. The third dielectric layer 27 is selectively etched under a condition in which the third dielectric layer 27 has a higher etching selectivity than the second dielectric layer 26 or under a condition in which the third dielectric layer 27 has a higher etching rate as compared with the second dielectric layer 26. For example, the third dielectric layer 27 may be selectively etched using a wet etching process. When the third dielectric layer 27 includes the void V, the void V in the third dielectric layer 27 may be exposed when the third dielectric layer 27 etched. When the void V is exposed, an etchant is introduced into the void V, so that the third dielectric layer 27 can be completely removed.

In addition, when the third dielectric layer 27 is etched, the first dielectric layer 25 exposed in the second opening OP2 may be etched together with the third dielectric layer 27. For example, when the first dielectric layer 25 and the third dielectric layer 27 include an oxide layer and the second dielectric layer 26 includes a nitride layer, the first dielectric layer 25 and the third dielectric layer 27 may be selectively etched. When the void V in the third dielectric layer 27 is exposed, the third dielectric layer 27 may be etched at a higher speed as compared with the first dielectric layer 25. Therefore, while the first dielectric layer 25 is etched in only the exposed region in the second opening OP2, the third dielectric layer 27 may be etched in not only the exposed region in the second opening OP2 but also the region formed in the second dielectric layer 26. An upper surface of the first dielectric layer 25 may be located at substantially the same level L1 as that of the second dielectric layer 26. In addition, the third dielectric layer 27 may be removed, and the second opening OP2 may extend into the second dielectric layer 26.

Figure 2E:
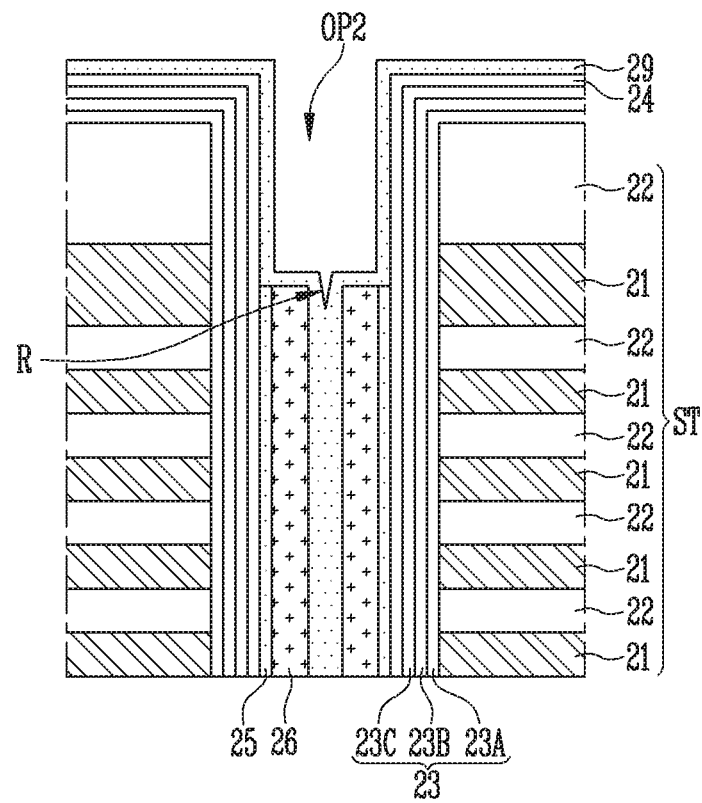

Referring to FIG. 2E, a fourth dielectric layer 29 is formed. The fourth dielectric layer 29 may be formed in the second dielectric layer 26. The fourth dielectric layer 29 may be formed with a thickness sufficient to fill in an opened central region of the second dielectric layer 26. The first dielectric layer 25 may be removed such that the fourth dielectric layer 29 also formed on the exposed channel layer 24.

The fourth dielectric layer 29 may be made of or include a material having a higher etching selectivity than the second dielectric layer 26, or may be made or include a material having a higher etching selectivity than the channel layer 24. For example, the fourth dielectric layer 29 may be made of or include the same material as the first dielectric layer 25 or the third dielectric layer 27. The fourth dielectric layer 29 may be made of or include an oxide layer.

Figure 2F:
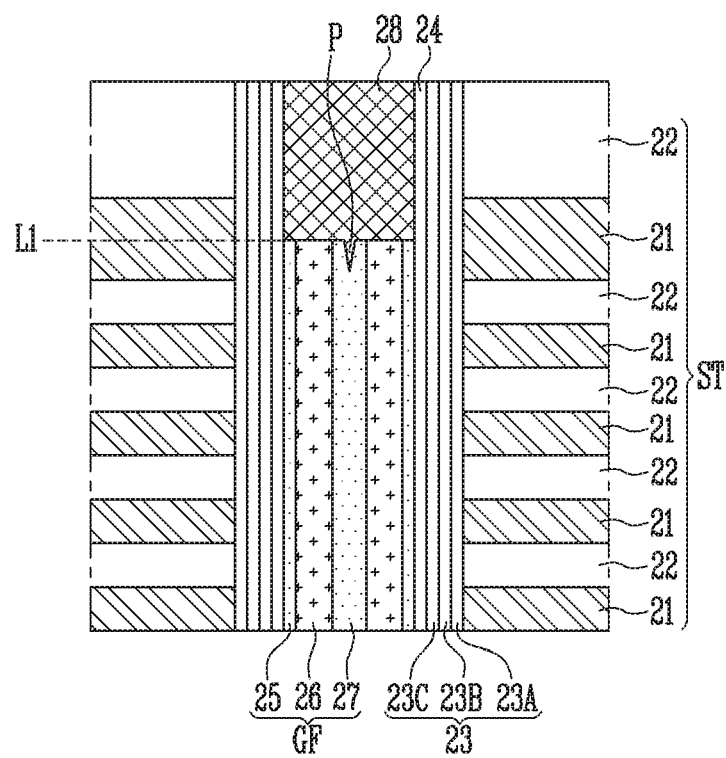

Referring to FIG. 2F, a region in the fourth dielectric layer 29, which protrudes above the upper surface of the second dielectric layer 26, is removed by etching. For example, the fourth dielectric layer 29 is etched using a dry cleaning process. Accordingly, the upper surfaces of the first dielectric layer 25, the second dielectric layer 26, and the fourth dielectric layer 29 are located at substantially the same level L1, and gap fill layers GF having a uniform height are formed. In addition, the gap fill layer GF may include a recess R formed at an uppermost surface thereof. For example, the recess R may be formed when the fourth dielectric layer 29 is deposited. The recess R may remain even after the fourth dielectric layer 29 is etched.

Subsequently, a pad 28 is formed on the gap fill layer GF. For example, a conductive layer is formed to fill in the second opening OP2, and a chemical mechanical process (CMP) is performed until the upper surface of the stack structure ST is exposed. Accordingly, the conductive layer, the fourth dielectric layer 29, the channel layer 24, and the memory layer 23, which are formed on the uppermost surface of the stack structure ST, are removed.

The pad 28 may be formed or include poly-silicon, metal, and the like. In addition, when the recess R exists at the upper surface of the gap fill layer GF, the pad 28 may include a protrusion portion P which is formed by filling in the recess R. For example, the pad 28 may be formed of a poly-silicon layer doped with an N-type impurity. The pad 28 may include a junction of a selection transistor.

Subsequently, although not shown in the drawing, a process of replacing the first material layers 21 and the second material layers 22 with third material layers may be performed. As an example, when the first material layers 21 are sacrificial layers and the second material layers 22 are insulating layers, the first material layers 21 may be replaced with conductive layers. The conductive layers may be formed after a memory layer is formed in the region in which the first material layers 21 are removed. As another example, when the first material layers 21 are conductive layers and the second material layers 22 are insulating layers, the first material layers 21 may be silicided. As still another example, when the first material layers 21 are conductive layers and the second material layers 22 are sacrificial layers, the second material layers 22 may be replaced with insulating layers.

According to the manufacturing method described above, after the second dielectric layer 26 is selectively etched, the third dielectric layer 27 is selectively etched. The third dielectric layer 27 is used as a sacrificial layer, and the fourth dielectric layer 29 is formed in the region in which the third dielectric layer 27 is removed. Thus, the gap fill layers GF can be etched to a uniform depth, and the pads 28 having a uniform thickness can be formed in the regions in which the gap fill layers GF are etched.

FIGS. 3A to 3D are sectional views illustrating a manufacturing method of a semiconductor device in accordance with an embodiment of the present disclosure. Hereinafter, contents overlapping with those described above will be omitted.

Figure 3A:
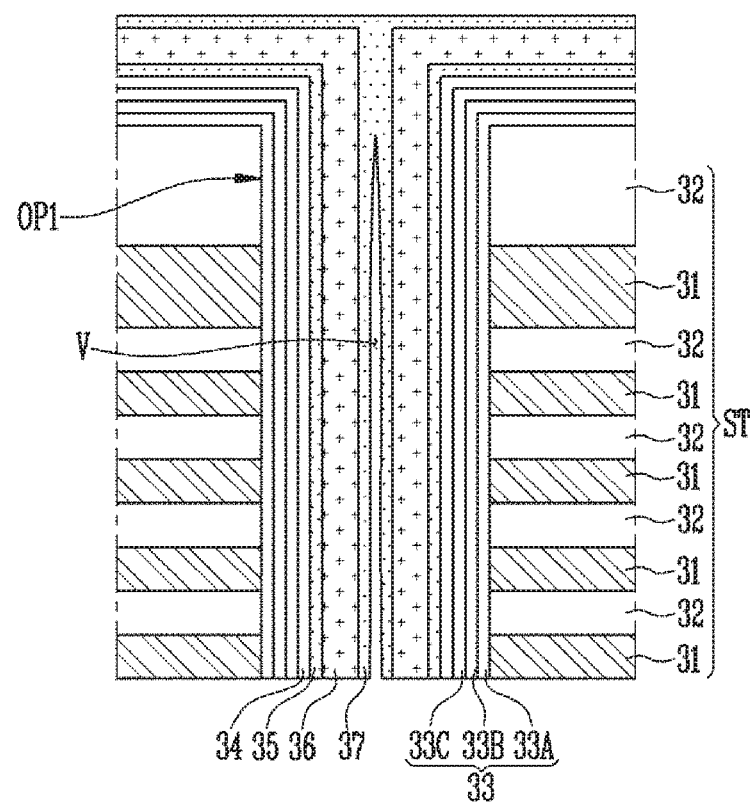
FIGS. 3A to 3D are sectional views illustrating a manufacturing method of a semiconductor device in accordance with an embodiment of the present disclosure.

Referring to FIG. 3A, there is formed a stack structure ST including first material layers 31 and second material layers 32, which are alternately stacked. A first opening OP1 penetrating the stack structure ST is then formed. Subsequently, a memory layer 33 is formed in the first opening OP1. The memory layer 33 may cover the internal surface of the sidewall of the first opening OP1 and formed over the uppermost second material layer 32. The memory layer 33 may include at least one of a tunnel insulating layer 33C, a data storage layer 33B, and a charge blocking layer 33A. Subsequently, a channel layer 34 is formed in the first opening OP1. The channel layer 34 may be formed conformally on the tunnel insulating layer 33C of the memory layer 33.

Subsequently, a gap fill layer including a plurality of dielectric layers 35 to 37 having different etching rates is formed in the channel layer 34. The plurality of dielectric layers 35 to 37 may be formed conformally along an inside sidewall surface of the channel layer 34. For example, a first dielectric layer 35, a second dielectric layer 36, and a third dielectric layer 37 are sequentially formed in the channel layer 34. The third dielectric layer 37 may completely fill in the first opening OP1, or alternatively may have a thickness with which it partially fills in the first opening OP1. When the third dielectric layer 27 only partially fills in the first opening OP1, a void V may be formed inside the third dielectric layer 27.

Figure 3B:
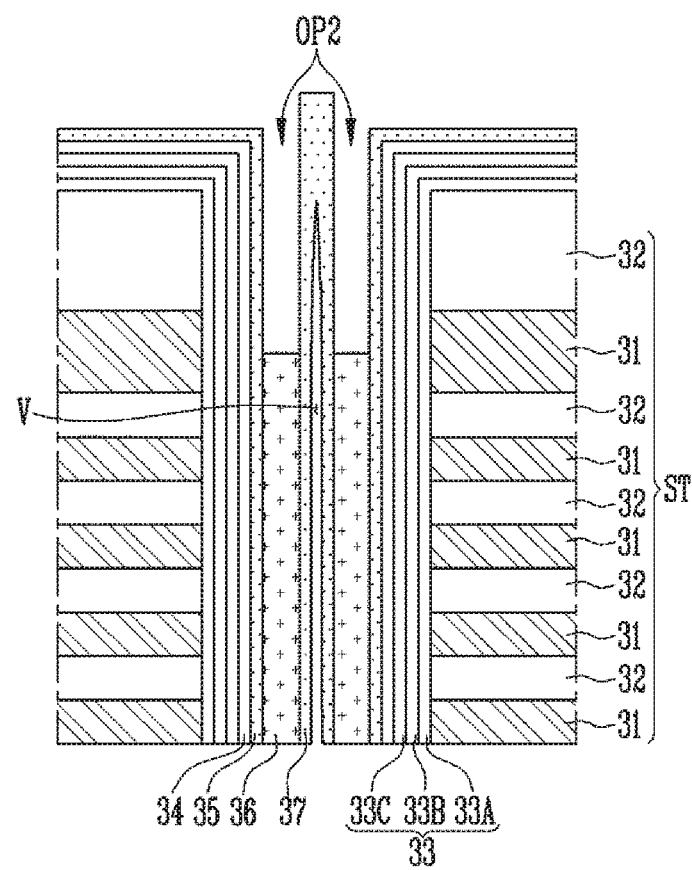

Referring to FIG. 3B, after the second dielectric layer 36 is exposed by etching the third dielectric layer 37, a second opening OP2 is formed by selectively etching the second dielectric layer 36. Thus, an upper partial region of the first dielectric layer 35 and an upper partial region of the third dielectric layer 37 may be exposed through the second opening OP2.

Figure 3C:
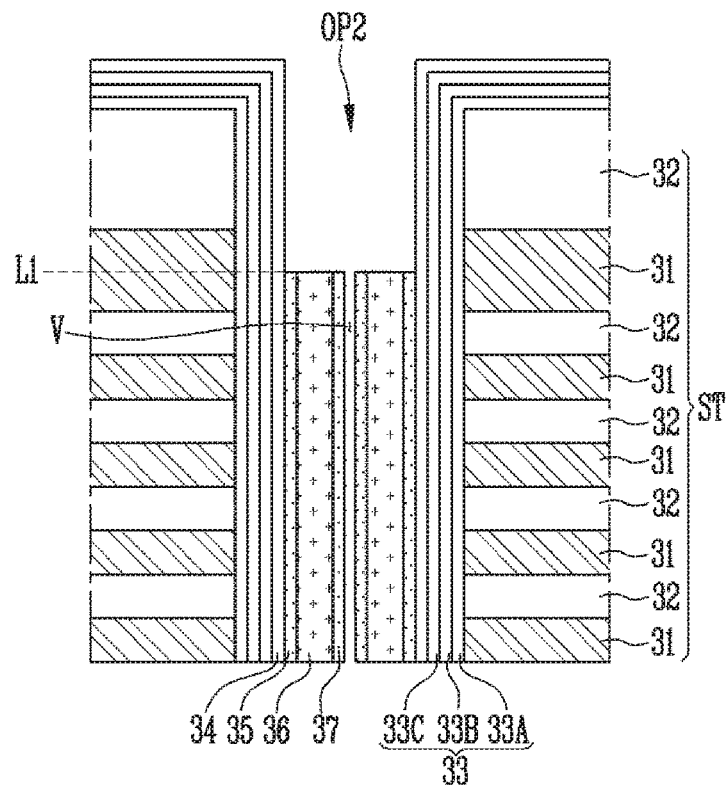

Referring to FIG. 3C, the third dielectric layer 37 exposed in the second opening OP2 is etched. The third dielectric layer 37 is selectively etched under a condition in which the third dielectric layer 37 has a higher etching selectivity than the second dielectric layer 36 or under a condition in which the third dielectric layer 37 has a higher etching rate as compared with the second dielectric layer 36. In addition, when the third dielectric layer 37 is etched, the first dielectric layer 35 exposed in the second opening OP2 may be etched together with the third dielectric layer 37. For example, when the first dielectric layer 35 and the third dielectric layer 37 include an oxide layer and the second dielectric layer 36 includes a nitride layer, the first dielectric layer 35 and the third dielectric layer 37 may be selectively etched.

When the first and third dielectric layers 35 and 37 are selectively etched, a dry etching process may be used. Although the void V is exposed in the third dielectric layer 37, the first dielectric layer 35 and the third dielectric layer 37 can be etched at a uniform speed. Thus, the upper regions of the first and third dielectric layers 35 and 37, which protrude to a level higher than an uppermost surface of the second dielectric layer 36, are etched, and the uppermost surfaces of the first to third dielectric layers 35 to 37 are located at substantially the same level L1.

Figure 3D:
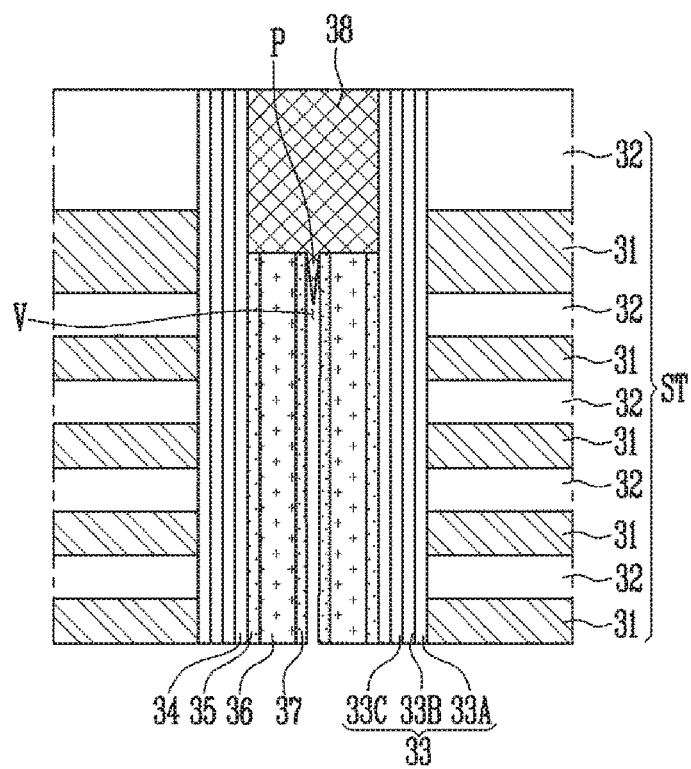

Referring to FIG. 3D, a pad 38 is formed on the first to third dielectric layers 35 to 37. The pad 38 may include a protrusion portion P protruding into the void V. For example, a conductive layer is formed to fill in the second opening OP2, and a chemical mechanical process (CMP) is then performed until an uppermost surface of the stack structure ST is exposed. Accordingly, the conductive layer, the channel layer 34, and the memory layer 33, which are formed on the uppermost surface of the stack structure ST, are removed.

According to the manufacturing method described above, after the second dielectric layer 35 is selectively etched, the first and third dielectric layers 35 and 37 are selectively etched. Since the first and third dielectric layers 35 and 37 are etched using the dry etching process, the depth to which the first and third dielectric layers 35 and 37 are etched can be controlled more easily. Thus, the pads 28 can be formed to have a uniform depth.

FIGS. 4A to 4F are sectional views illustrating a manufacturing method of a semiconductor device in accordance with an embodiment of the present disclosure. Hereinafter, contents overlapping with those described above will be omitted.

Figure 4A:
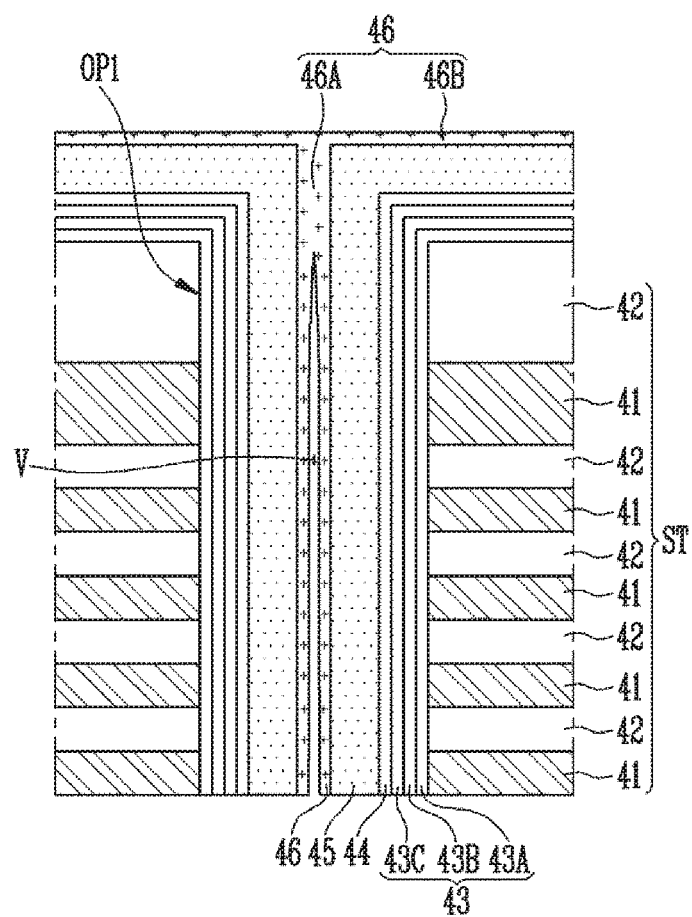
FIGS. 4A to 4F are sectional views illustrating a manufacturing method of a semiconductor device in accordance with an embodiment of the present disclosure.

Referring to FIG. 4A, there is formed a stack structure ST including first material layers 41 and second material layers 42, which are alternately stacked. Subsequently, a first opening OP1 penetrating the stack structure ST is formed. A memory layer 43 and a channel layer 44 are formed in the first opening OP1. The memory layer 43 may be formed conformally along an inside sidewall surface of the first opening OP1. Then the channel layer 44 may be formed conformally along an inside sidewall surface of the memory layer 43. The memory layer 43 may include at least one of a tunnel insulating layer 43C, a data storage layer 43B, and a charge blocking layer 43A.

Subsequently, a gap fill layer including a plurality of dielectric layers 45 and 46 having different etching rates is formed in the channel layer 44. The dielectric layers 45 and 46 may be formed conformally along an inside sidewall surface of the channel layer 44. For example, a first dielectric layer 45 is formed conformally along an inside sidewall surface of the channel layer 44, and a second dielectric layer 46 is then formed conformally along an inside sidewall surface of the first dielectric layer 45. The second dielectric layer 46 may be made of or include a material having a higher etching selectivity than the first dielectric layer 45. Also, the second dielectric layer 46 may be a sacrificial layer. As an example, the first dielectric layer 45 may be made of or include an oxide layer and the second dielectric layer 46 may be made of or include a nitride layer. As another example, the first dielectric layer 45 may be made of or include an oxide layer and the second dielectric layer 46 may be made of or include a metal. In an embodiment, the second dielectric layer 46 may be a titanium nitride layer.

The second dielectric layer 46 may completely fill in the first opening OP1, or may be formed with a thickness with which it partially fills in the first opening OP1. The second dielectric layer 46 may include a first region 46A penetrating the stack structure and a second region 46B formed on the top of the stack structure ST. In addition, a void V may be formed in the first region 46A.

Figure 4B:
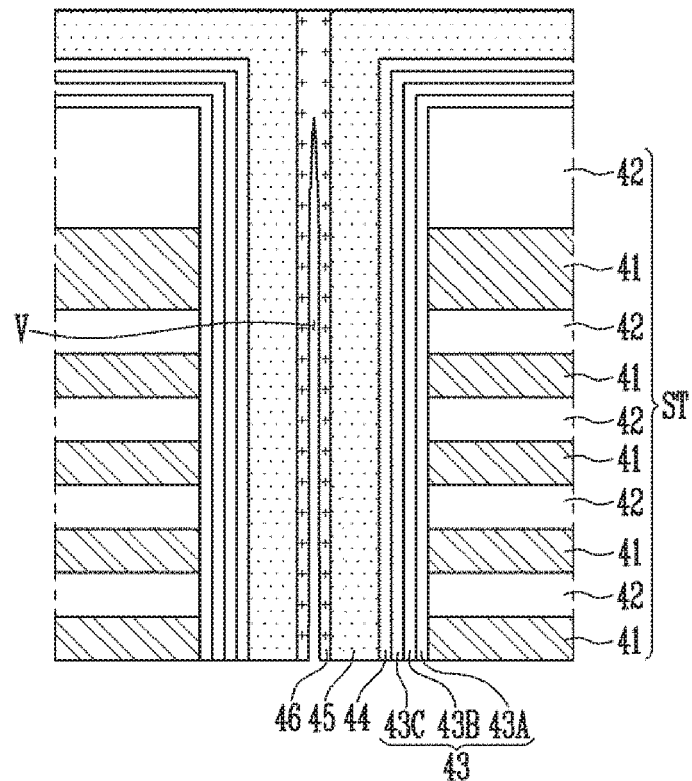

Referring to FIG. 4B, the second dielectric layer 46 is partially removed to expose the first dielectric layer 45. For example, the second region 46B of the second dielectric layer 46 is etched using a dry cleaning process. The etching amount of the second dielectric layer 46 may be controlled such that the void V in the second dielectric layer 46 is not exposed.

Figure 4C:
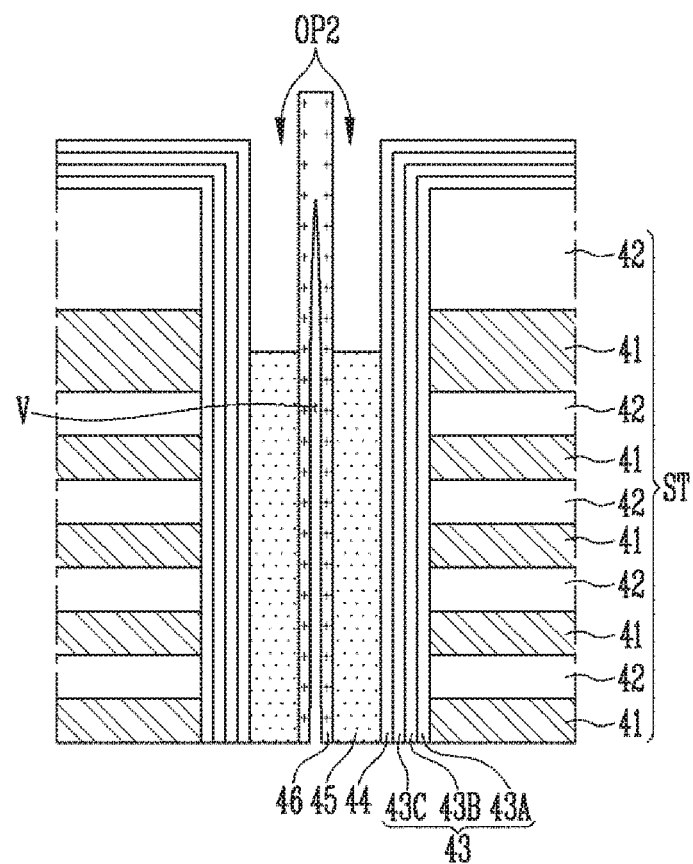

Referring to FIG. 4C, a second opening OP2 is formed by selectively etching the first dielectric layer 45. For example, the first dielectric layer 45 is selectively etched under a condition in which the first dielectric layer 45 has a higher etching selectivity than the second dielectric layer 46 or under a condition in which the first dielectric layer 45 has a higher etching rate as compared with the second dielectric layer 46. The first dielectric layer 45 may be selectively etched using a wet etching process. Accordingly, the second dielectric layer 46 is exposed in the second opening OP2, and protrudes from an uppermost surface of the first dielectric layer 45.

Figure 4D:
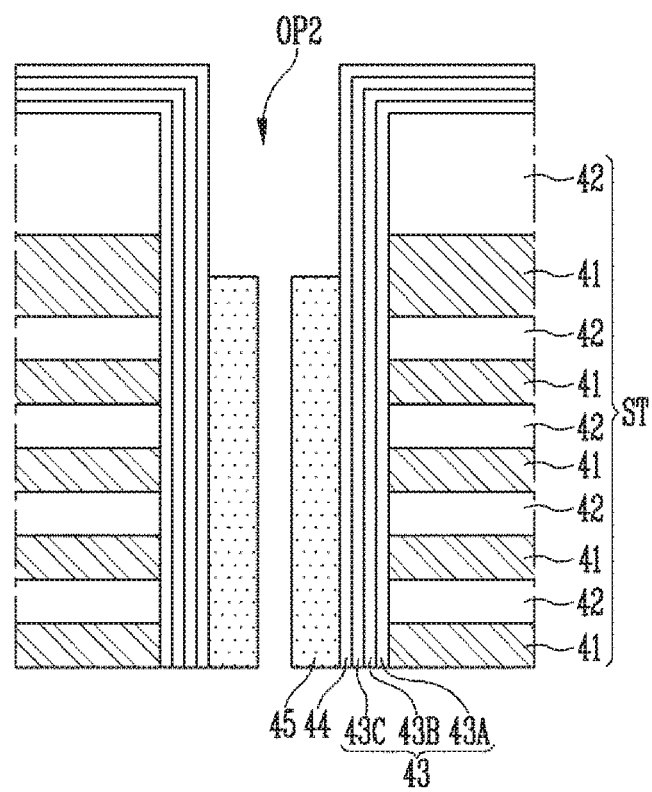

Referring to FIG. 4D, the second dielectric layer 46 which is exposed in the second opening OP2 is etched. The second dielectric layer 46 is selectively etched under a condition in which the second dielectric layer 46 has a higher etching selectivity than the first dielectric layer 45 or under a condition in which the second dielectric layer 46 has a higher etching rate as compared with the first dielectric layer 45. For example, the second dielectric layer 46 may be selectively etched using a wet etching process. When the second dielectric layer 46 includes the void V, the void V in the second dielectric layer 46 may be exposed when the second dielectric layer 46 is etched. If the void V is exposed, an etchant is introduced into the void V, so that the second dielectric layer 46 can be completely removed.

Figure 4E:
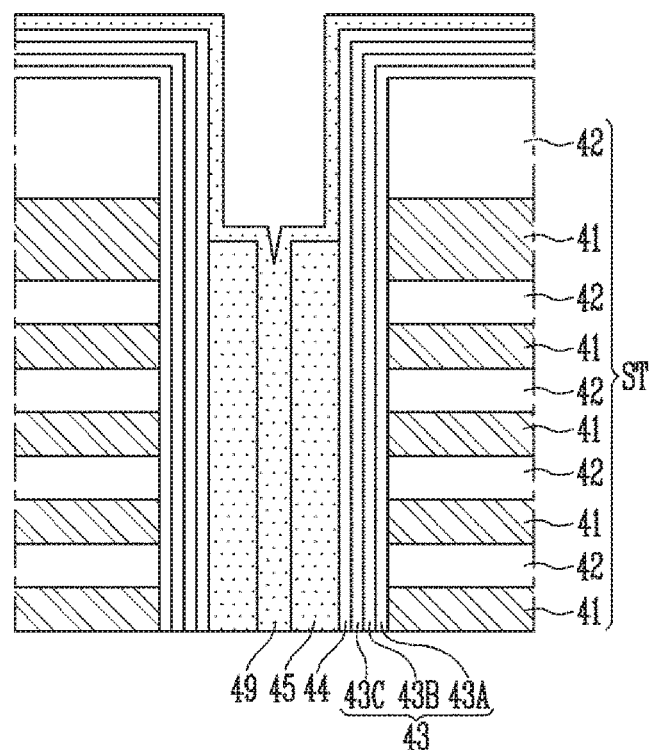

Referring to FIG. 4E, a fourth dielectric layer 49 is formed. The fourth dielectric layer 49 may be formed in the second dielectric layer 46. Thus, a central region of the first dielectric layer 45 is opened. The fourth dielectric layer 49 may be formed with a thickness sufficient to fill in the opened central region of the first dielectric layer 45. The fourth dielectric layer 49 may be made of or include a material having a higher etching selectivity than the first dielectric layer 45, or include a material having a higher etching selectivity than the channel layer 44. For example, the fourth dielectric layer 49 may be made of or include the same material as the first dielectric layer 45. The fourth dielectric layer 49 may be made of or include an oxide layer.

Figure 4F:
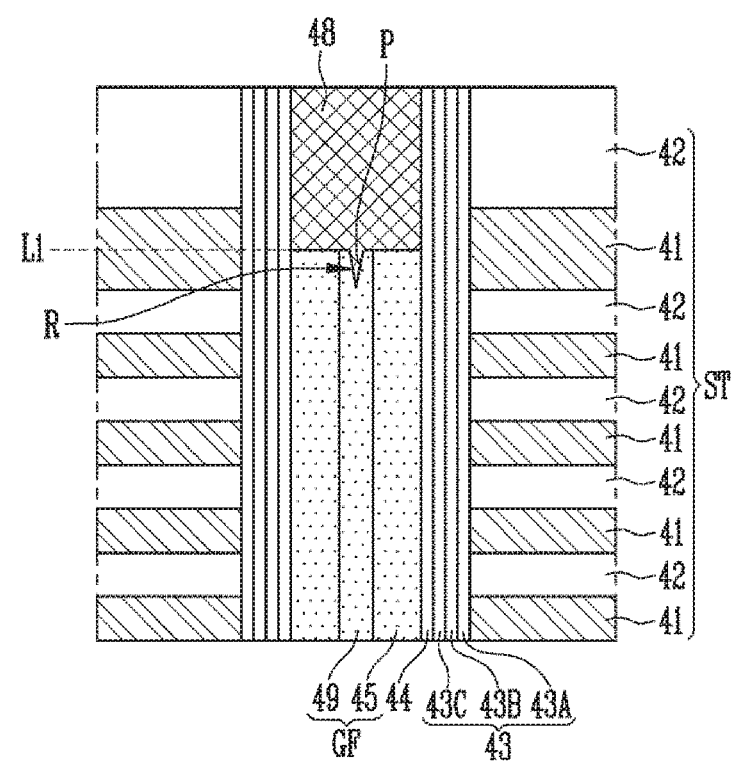

Referring to FIG. 4F, a region of the fourth dielectric layer 49, which protrudes to a level higher than the uppermost surface of the first dielectric layer 45, is etched. For example, the fourth dielectric layer 49 is etched using a dry cleaning process. Accordingly, the first dielectric layer 45 and the fourth dielectric layer 49 are located at substantially the same level L1, and gap fill layers GF having a uniform height are formed. In addition, the gap fill layer GF may include a recess R at an uppermost surface thereof.

Subsequently, a pad 48 is formed on the first and fourth dielectric layers 45 and 49. For example, a conductive layer is formed to fill in the second opening OP2, and a chemical mechanical process (CMP) is then performed until an uppermost surface of the stack structure ST is exposed. Accordingly, the conductive layer, the channel layer 44, and the memory layer 43, which are formed on the uppermost surface of the stack structure ST, are removed.

The pad 48 may include a protrusion portion P protruding from a bottom surface thereof, and the protrusion portion P may fill in the recess R located at the upper surface of the gap fill layer GF.

In accordance with the manufacturing method described above, after the first dielectric layer 45 is selectively etched, the second dielectric layer 45 is selectively etched. The second dielectric layer 46 is used as a sacrificial layer, and the fourth dielectric layer 49 is formed in the region in which the second dielectric layer 46 is removed. Thus, the gap fill layers GF can be etched to a uniform depth, and the pads 48 having a uniform thickness can be formed in the regions in which the gap fill layers GF are etched.

FIGS. 5A to 5D are sectional views illustrating a manufacturing method of a semiconductor device in accordance with an embodiment of the present disclosure. Hereinafter, contents overlapping with those described above will be omitted.

Figure 5A:
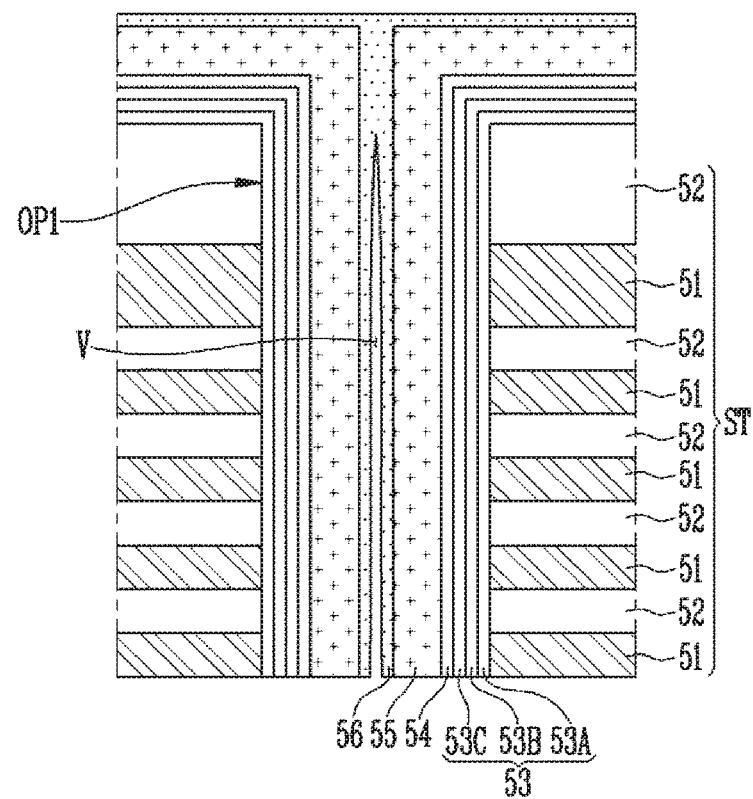
FIGS. 5A to 5D are sectional views illustrating a manufacturing method of a semiconductor device in accordance with an embodiment of the present disclosure.

Referring to FIG. 5A, there is formed a stack structure ST including first material layers 51 and second material layers 52, which are alternately stacked. Subsequently, a first opening OP1 penetrating the stack structure ST is formed, and a memory layer 53 and a channel layer 54 are then formed in the first opening OP1. The memory layer 53 may include at least one of a tunnel insulating layer 53C, a data storage layer 53B, and a charge blocking layer 53A.

Subsequently, a gap fill layer including a plurality of dielectric layers 55 and 56 having different etching rates is formed in the channel layer 54. The dielectric layers 55 and 56 may be formed conformally along an inside sidewall surface of the channel layer 54. For example, a first dielectric layer 55 is formed conformally along an inside sidewall surface of the channel layer 54, and a second dielectric layer 56 is then formed conformally along an inside sidewall surface of the first dielectric layer 55. The second dielectric layer 56 may be made of or include a material having a higher etching selectivity than the first dielectric layer 55. As an example, the first dielectric layer 55 may be made of or include an oxide layer and the second dielectric layer 56 may be made of or include a nitride layer. As another example, the first dielectric layer 55 may be made of or include a nitride layer and the second dielectric layer 56 may be made of or include an oxide layer.

Figure 5B:
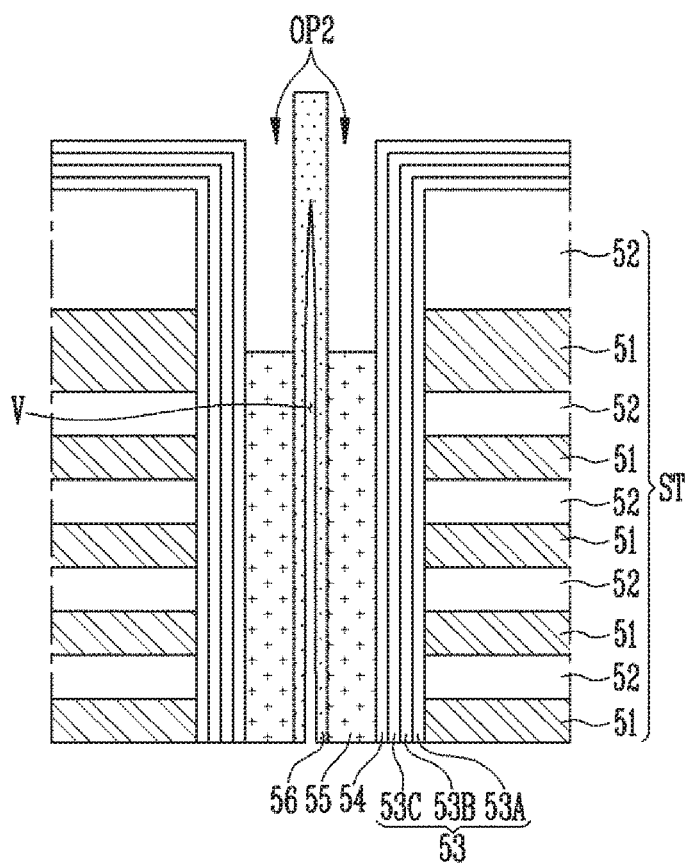

Referring to FIG. 5B, the first dielectric layer 55 is exposed by partially etching the second dielectric layer 56, and a second opening OP2 is then formed by selectively etching the first dielectric layer 55. For example, the first dielectric layer 55 is selectively etched under a condition in which the first dielectric layer 55 has a higher etching selectivity than the second dielectric layer 56 or under a condition in which the first dielectric layer 55 has a higher etching rate as compared with the second dielectric layer 56. The first dielectric layer 55 may be selectively etched using a wet etching process.

Figure 5C:
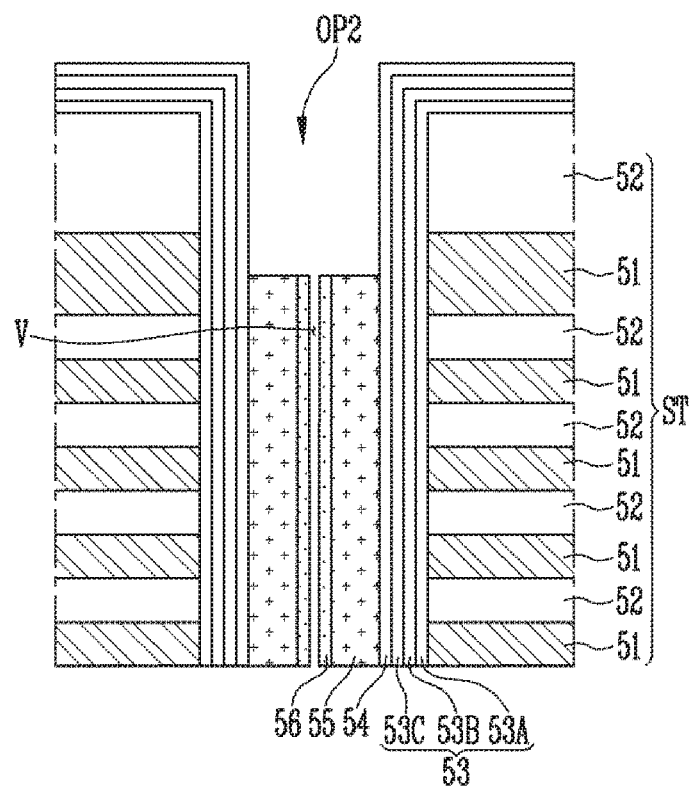

Referring to FIG. 5C, the second dielectric layer 56 exposed in the second opening OP2 is etched. When the second dielectric layer 56 includes a void V, the void V in the second dielectric layer 56 may be exposed when the second dielectric layer 56 is etched. The second dielectric layer 56 may be selectively etched using a dry etching process. By using the dry etching process, although the void V in the second dielectric layer 56 is exposed, the etching speed of the second dielectric layer 56 can be prevented from being rapidly increased, or even a region of the second dielectric layer 56, which is formed in the first dielectric layer 55, can be prevented from being entirely etched. Thus, a region of the second dielectric layer 56, which further protrudes than an uppermost surface of the first dielectric layer 55, is etched, and the uppermost surfaces of the first and second dielectric layers 55 and 56 are located at substantially the same level L1.

Figure 5D:
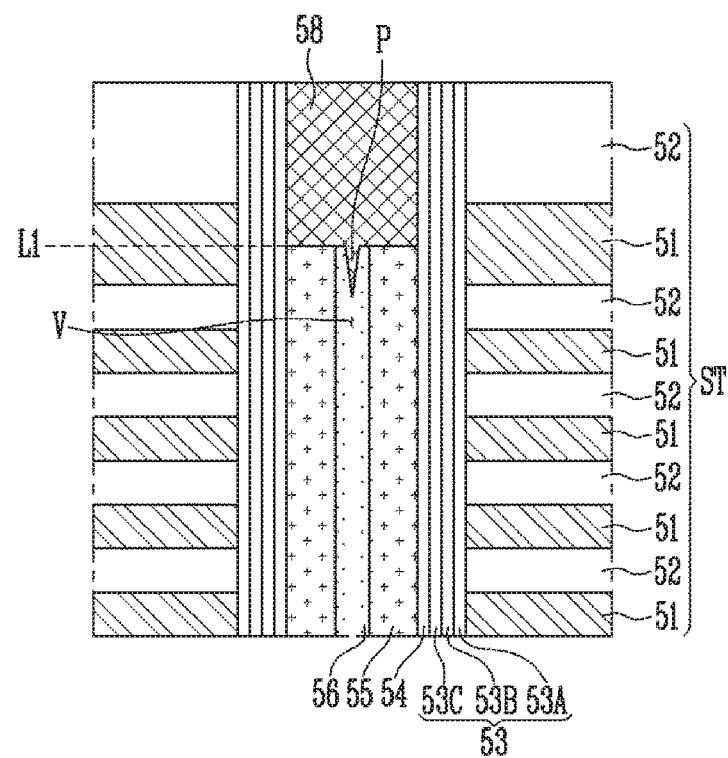

Referring to FIG. 5D, a pad 58 is formed on the first and second dielectric layers 55 and 56. The pad 58 may include a protrusion portion P protruding into the void V. For example, a conductive layer is formed to fill in the second opening OP2, and a chemical mechanical process (CMP) is then performed until an uppermost surface of the stack structure ST is exposed. Accordingly, the conductive layer, the channel layer 54, and the memory layer 53, which are formed on the uppermost surface of the stack structure ST, are removed.

According to the manufacturing method described above, after the first dielectric layer 55 is selectively etched, the second dielectric layer 56 is selectively etched. Since the second dielectric layer 56 is etched using the dry etching process, the depth to which the second dielectric layer 56 is etched can be controlled more easily. Thus, the pads 58 can be formed to have a uniform depth.

Figure 6:
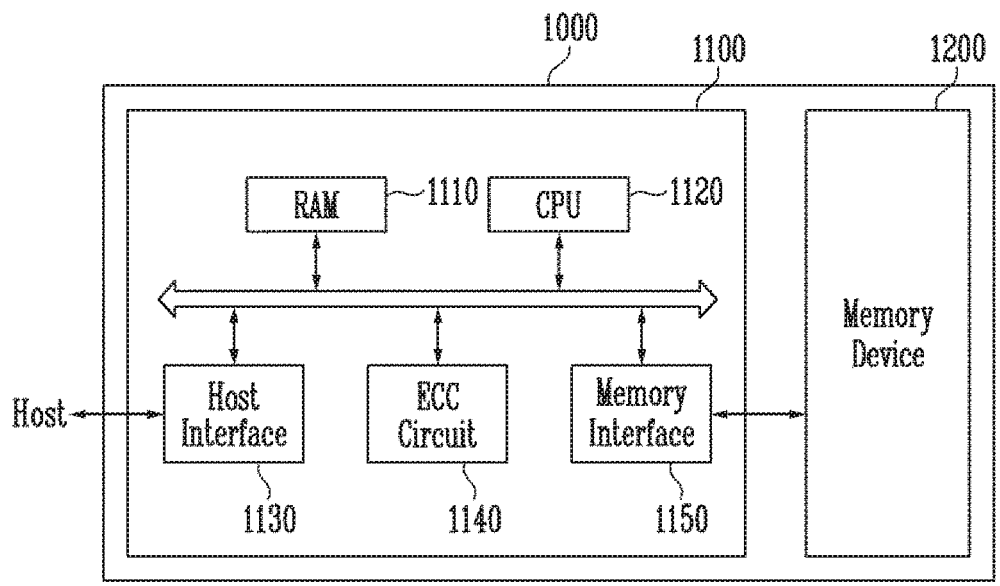
FIGS. 6 and 7 are block diagrams illustrating configurations of memory systems in accordance with embodiments of the present disclosure.

FIG. 6 is a block diagram illustrating a configuration of a memory system in accordance with an embodiment of the present disclosure.

Referring to FIG. 6, the memory system 1000 in accordance with the embodiment of the present disclosure includes a memory device 1200 and a controller 1100.

The memory device 1200 is used to store data information having various data formats such as texts, graphics, and software codes. The memory device 1200 may be a nonvolatile memory. Also, the memory device 1200 may have the structures described with reference to FIGS. 1A to 5D, and be manufactured in accordance with the manufacturing method described with reference to FIGS. 1A to 5D. In an embodiment, the memory device 1200 may include: a stack structure; a channel layer penetrating the stack structure; a first dielectric layer formed in the channel layer; a second dielectric layer formed in the first dielectric layer; and a third dielectric layer interposed between the first dielectric layer and the second dielectric layer, the third dielectric layer including a material having a higher etching selectivity than the first and second dielectric layers. The structure and manufacturing method of the memory device 1200 are the same as described above, and therefore, their detailed descriptions will be omitted.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 includes a random-access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random-access memory (SRAM), a read only memory (ROM), and the like.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes a NAND interface or a NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure includes the memory device 1200 having an improved degree of integration and improved characteristics, and thus the degree of integration and characteristics of the memory system 1000 can be improved.

Figure 7:
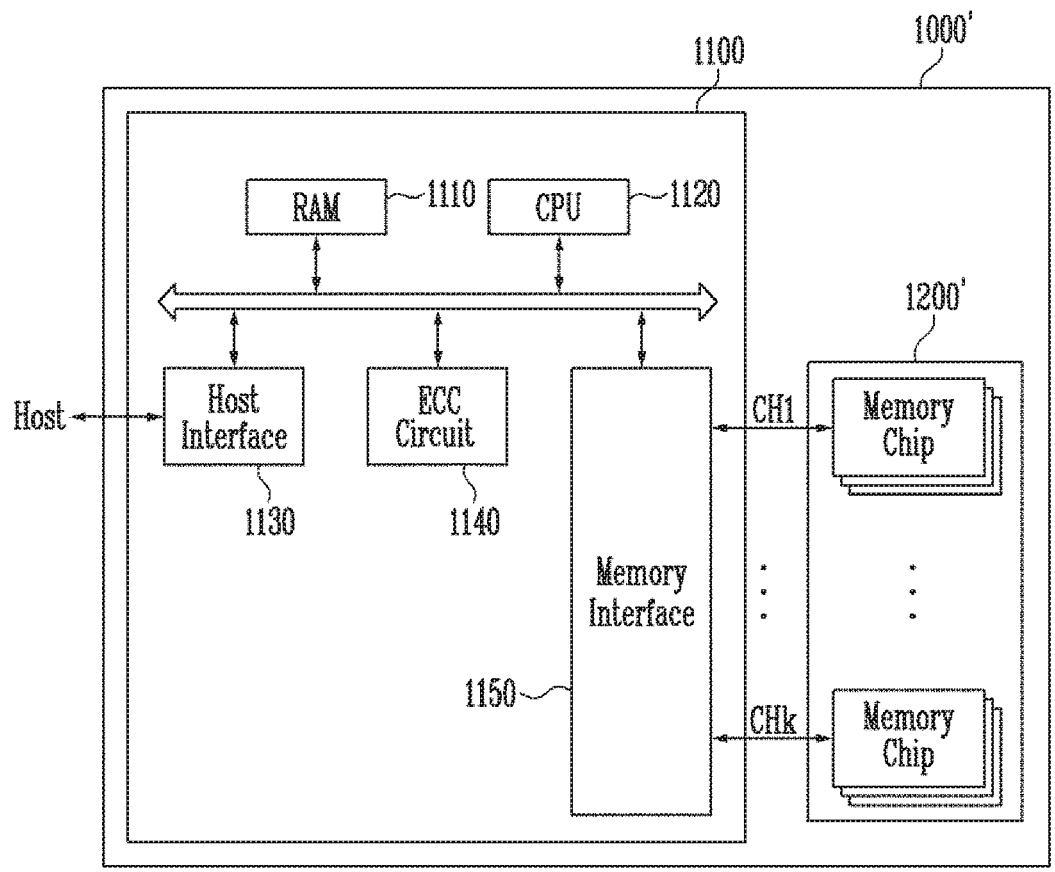

FIG. 7 is a block diagram illustrating a configuration of a memory system in accordance with an embodiment of the present disclosure. Hereinafter, descriptions of contents overlapping with those described above will be omitted.

Referring to FIG. 7, the memory system 1000' in accordance with the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 5D, and be manufactured in accordance with the manufacturing method described with reference to FIGS. 1A to 5D. In an embodiment, the memory device 1200' may include: a stack structure; a channel layer penetrating the stack structure; a first dielectric layer formed in the channel layer; a second dielectric layer formed in the first dielectric layer; and a third dielectric layer interposed between the first dielectric layer and the second dielectric layer, the third dielectric layer including a material having a higher etching selectivity than the first and second dielectric layers. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with the embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 8:
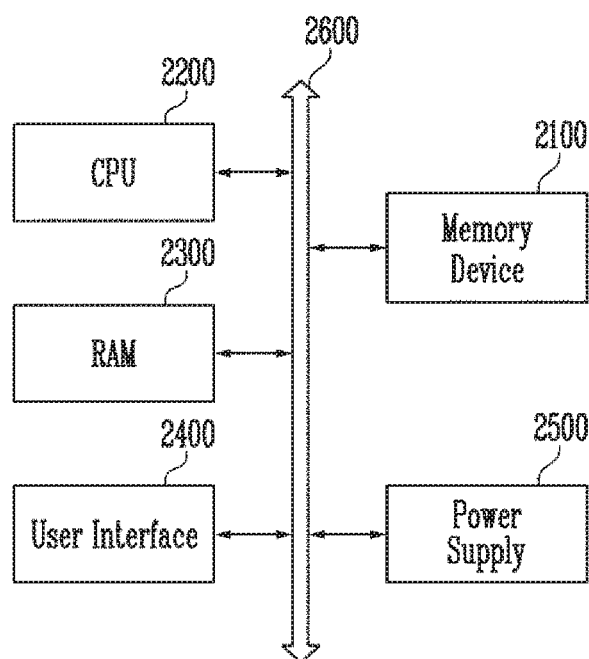
FIGS. 8 and 9 are block diagrams illustrating configurations of computing systems in accordance with embodiments of the present disclosure.

FIG. 8 is a block diagram illustrating a configuration of a computing system in accordance with an embodiment of the present disclosure. Hereinafter, description of contents overlapping with those described above will be omitted.

Referring to FIG. 8, the computing system 2000 in accordance with the embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, and the like.

Here, the memory device 2100 may be a nonvolatile memory. Also, the memory device 2100 may have the structures described with reference to FIGS. 1A to 5D, and be manufactured in accordance with the manufacturing method described with reference to FIGS. 1A to 5D. In an embodiment, the memory device 2100 may include: a stack structure; a channel layer penetrating the stack structure; a first dielectric layer formed in the channel layer; a second dielectric layer formed in the first dielectric layer; and a third dielectric layer interposed between the first dielectric layer and the second dielectric layer, the third dielectric layer including a material having a higher etching selectivity than the first and second dielectric layers. The structure and manufacturing method of the memory device 2100 are the same as described above, and therefore, their detailed descriptions will be omitted.

The memory device 2100 may be a multi-chip package including a plurality of memory chips as described with reference to FIG. 7.

The computing system 2000 configured as described above may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, and the like.

As described above, the computing system 2000 in accordance with the embodiment of the present disclosure includes the memory device 2100 having an improved degree of integration and improved characteristics, and thus the degree of integration and characteristics of the computing system 2000 can be improved.

Figure 9:
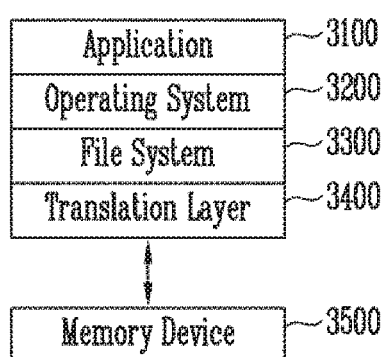

FIG. 9 is a block diagram illustrating a computing system in accordance with an embodiment of the present disclosure.

Referring to FIG. 9, the computing system 3000 in accordance with the embodiment of the present disclosure includes a software layer including an operating system 3200, an application 3100, a file system 3300, a translation layer 3400, and the like. In addition, the computing system 3000 includes a hardware layer of a memory device 3500, and the like.

The operating system 3200 may manage software resources, hardware resources, and the like of the computing system 3000, and control program execution of a central processing unit. The application 3100 is one of a variety of application programs running on the computing system 3000, and may be a utility executed by the operating system 3200.

The file system 3300 means a logical structure for managing data, files, and the like in the computing system 3000, and organizes the data or files stored in the memory device 3500 in accordance with a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), and the like.

The memory device 3500 may be a nonvolatile memory. Also, the memory device 3500 may have the structures described with reference to FIGS. 1A to 5D, and be manufactured in accordance with the manufacturing method described with reference to FIGS. 1A to 5D. In an embodiment, the memory device 3500 may include: a stack structure; a channel layer penetrating the stack structure; a first dielectric layer formed in the channel layer; a second dielectric layer formed in the first dielectric layer; and a third dielectric layer interposed between the first dielectric layer and the second dielectric layer, the third dielectric layer including a material having a higher etching selectivity than the first and second dielectric layers. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 in accordance with the embodiment of the present disclosure includes the memory device 3500 having an improved degree of integration and improved characteristics, and thus the degree of integration and characteristics of the computing system 3000 can be improved.

In accordance with the present disclosure, there can be provided a semiconductor device having a stable structure and improved reliability. Also, in manufacturing of the semiconductor device, the level of difficulty of processes can be lowered, a manufacturing procedure can be simplified, and manufacturing cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack structure;
   a channel layer penetrating the stack structure;
   a gap fill layer including first, second and third dielectric layers, wherein the first dielectric layer is formed in the channel
   layer, the second dielectric layer is formed in the first dielectric layer, a third dielectric layer is interposed between the first dielectric layer and the second dielectric layer, and the third dielectric layer includes a material having a higher etching selectivity than the first and second dielectric layers; and
   a pad located over the gap fill layer, the pad including a protrusion portion protruding into the gap fill layer.

2. The semiconductor device of claim 1, wherein the pad is located on the top of the first to third dielectric layers in the channel layer, and the protrusion portion protrudes into the second dielectric layer.

3. The semiconductor device of claim 1, wherein the first dielectric layer and the second dielectric layer include an oxide layer, and the third dielectric layer includes a nitride layer.

4. The semiconductor device of claim 1, wherein an upper surface of the gap fill layer includes a recess.

5. The semiconductor device of claim 4, wherein the recess has a V shaped cross-section or a wedge-shaped cross-section.

6. The semiconductor device of claim 4, wherein the recess is partially filled by the protrusion portion.

7. The semiconductor device of claim 4, wherein the recess is completely filled by the protrusion portion.

8. A semiconductor device comprising:
   a stack structure;
   a channel layer penetrating the stack structure;
   a first dielectric layer formed in the channel layer;
   a second dielectric layer formed in the first dielectric layer, wherein the second dielectric layer includes a void;
   a third dielectric layer interposed between the first dielectric layer and the second dielectric layer, the third dielectric layer including a material having a higher etching selectivity than the first and second dielectric layers.

9. A semiconductor device comprising:
   a stack structure;
   a channel layer penetrating the stack structure;
   a first dielectric layer formed in the channel layer;
   a second dielectric layer formed in the first dielectric layer, wherein an upper surface of the second dielectric layer includes a recess; and
   a pad located on the top of the first and second dielectric layers, the pad including a protrusion portion protruding into the recess of the second dielectric layer.

10. The semiconductor device of claim 9, wherein the protrusion portion of the pad fills in the recess.

11. The semiconductor device of claim 9, wherein the second dielectric layer includes a void, and the protrusion portion of the pad protrudes into the void.

12. The semiconductor device of claim 9, further comprising a third dielectric layer interposed between the first dielectric layer and the second dielectric layer, the third dielectric layer including a material having a higher etching selectivity than the first and second dielectric layers.

13. The semiconductor device of claim 12, wherein the first dielectric layer and the second dielectric layer include an oxide layer, and the third dielectric layer includes a nitride layer.

14. The semiconductor device of claim 9, wherein the first dielectric layer includes a nitride layer and the second dielectric layer includes an oxide layer.

15. The semiconductor device of claim 9, wherein the first dielectric layer includes an oxide layer and the second dielectric layer includes a nitride layer.

16. The semiconductor device of claim 9, wherein the recess has a V shaped cross-section or a wedge-shaped cross-section.

17. The semiconductor device of claim 9, wherein the recess is partially filled by the protrusion portion.

18. The semiconductor device of claim 9, wherein the recess is completely filled by the protrusion portion.

\* \* \* \* \*